United States Patent
Inoue et al.

(10) Patent No.: US 12,456,632 B2
(45) Date of Patent: Oct. 28, 2025

(54) SUBSTRATE PROCESSING METHOD AND SUBSTRATE PROCESSING APPARATUS

(71) Applicant: Tokyo Electron Limited, Tokyo (JP)

(72) Inventors: Saya Inoue, Koshi (JP); Satoru Tanaka, Koshi (JP); Shinichiro Shimomura, Koshi (JP); Toru Ihara, Koshi (JP); Satoshi Biwa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 641 days.

(21) Appl. No.: 17/814,267

(22) Filed: Jul. 22, 2022

(65) Prior Publication Data

US 2023/0022814 A1 Jan. 26, 2023

(30) Foreign Application Priority Data

Jul. 26, 2021 (JP) ................. 2021-121925

(51) Int. Cl.
*H01L 21/67* (2006.01)
*H01L 21/02* (2006.01)

(52) U.S. Cl.
CPC .. *H01L 21/67034* (2013.01); *H01L 21/02052* (2013.01)

(58) Field of Classification Search
CPC ......... H01L 21/02101; H01L 21/02041; H01L 21/02052; H01L 21/02054; H01L 21/02057; H01L 21/67028; H01L 21/67034; H01L 21/67017; H01L 21/67051

See application file for complete search history.

(56) References Cited

U.S. PATENT DOCUMENTS

2012/0308346 A1\* 12/2012 Keigler .................. H01L 21/68
    414/222.09
2013/0000140 A1\* 1/2013 Jung ................. H01L 21/67017
    34/523
2020/0047224 A1\* 2/2020 Fukui ............... H01L 21/02046

FOREIGN PATENT DOCUMENTS

JP      2003161578 A   \*   6/2003   ....... H01L 21/67034
JP      2014-101241 A      6/2014
JP      2020-025013 A      2/2020

\* cited by examiner

*Primary Examiner* — Steven B McAllister
*Assistant Examiner* — Xiaoting Hu
(74) *Attorney, Agent, or Firm* — Chrisman Gallo Tochtrop LLC

(57) ABSTRACT

A substrate processing method of drying a substrate by using a processing fluid in a supercritical state is performed by a substrate processing apparatus. The substrate processing apparatus includes a fluid discharge unit, a supply line, a fluid drain unit, a drain line and a flow control device. The substrate processing method includes: flowing the processing fluid from the fluid discharge unit to the fluid drain unit such that the processing fluid flows along a surface of the substrate. The flowing of the processing fluid includes flowing the processing fluid in a first flow mode and flowing the processing fluid in a second flow mode. Between the first flow mode and the second flow mode, a flow direction distribution of the processing fluid is different, and a switchover between the first flow mode and the second flow mode is performed by the flow control device.

15 Claims, 7 Drawing Sheets

SUBSTRATE PROCESSING METHOD AND SUBSTRATE PROCESSING APPARATUS

CROSS-REFERENCE TO RELATED APPLICATION

This application claims the benefit of Japanese Patent Application No. 2021-121925 filed on Jul. 26, 2021, the entire disclosure of which is incorporated herein by reference.

TECHNICAL FIELD

The various aspects and embodiments described herein pertain generally to a substrate processing method and a substrate processing apparatus.

BACKGROUND

In a semiconductor device manufacturing process for forming a stacked structure of an integrated circuit on a surface of a substrate such as a semiconductor wafer (hereinafter, simply referred to as a wafer), a liquid processing such as chemical liquid cleaning or wet etching is performed. When removing a liquid or the like adhering to the surface of the wafer by such a liquid processing, a drying method using a processing fluid in a supercritical state has been performed in recent years (see, for example, Patent Document 1).

Patent Document 1: Japanese Patent Laid-open Publication No. 2014-101241

SUMMARY

In one exemplary embodiment, there is provided a substrate processing method of drying a substrate, which has a liquid adhering to a surface thereof, by using a processing fluid in a supercritical state. The substrate processing method is performed by using a substrate processing apparatus. The substrate processing apparatus includes a processing vessel; a substrate holder configured to hold the substrate horizontally within the processing vessel such that the surface of the substrate faces upwards; a fluid discharge unit configured to discharge the processing fluid into the processing vessel; a fluid drain unit configured to drain the processing fluid from the processing vessel; a supply line, connected to the fluid discharge unit, through which the processing fluid is supplied to the fluid discharge unit from a fluid source configured to supply the processing fluid in the supercritical state; a drain line connected to the fluid drain unit; and a flow control device provided in at least one of the supply line or the drain line, and configured to control a flow of the processing fluid flowing within the processing vessel from the fluid discharge unit toward the fluid drain unit. The substrate processing method includes: flowing the processing fluid from the fluid discharge unit to the fluid drain unit such that the processing fluid flows along the surface of the substrate held by the substrate holder. The flowing of the processing fluid includes flowing the processing fluid in a first flow mode in the processing vessel and flowing the processing fluid in a second flow mode in the processing vessel. Between the first flow mode and the second flow mode, a flow direction distribution of the processing fluid flowing along the surface of the substrate in the processing vessel is different when viewed from a direction normal to the surface of the substrate, and a switchover between the first flow mode and the second flow mode is performed by the flow control device.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
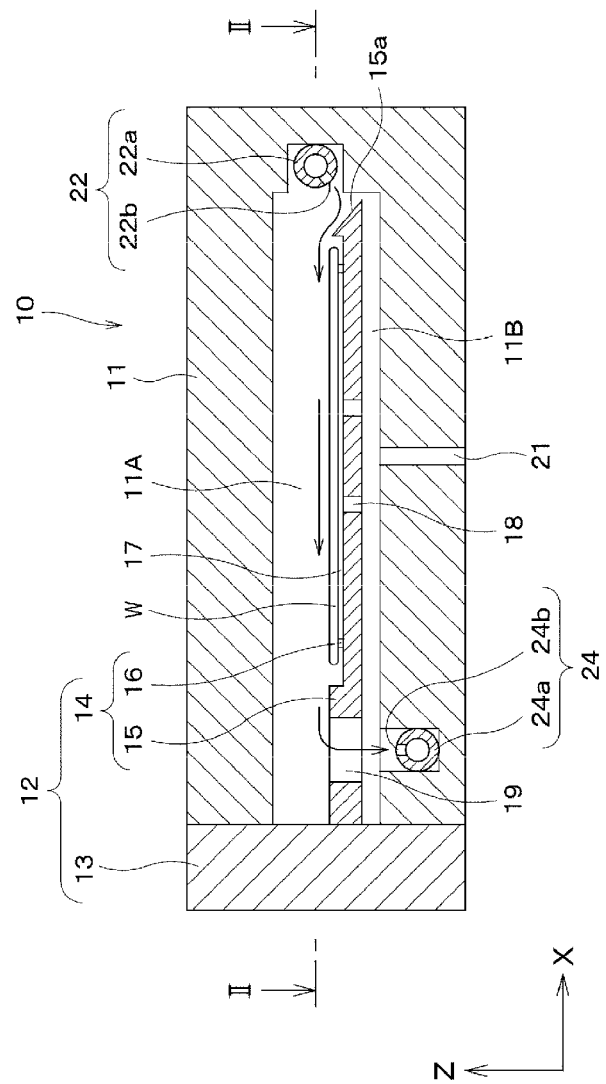
FIG. 1 is a schematic longitudinal sectional view illustrating an example configuration of a processing unit of a supercritical drying apparatus according to exemplary embodiment of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A supercritical drying apparatus as an example of a substrate processing apparatus will be described with reference to the accompanying drawings. This supercritical drying apparatus may be used to perform a supercritical drying processing of drying a substrate W having a liquid film of a liquid (for example, isopropyl alcohol (IPA)) on a front surface thereof by using a processing fluid (for example, carbon dioxide) in a supercritical state. The substrate W is, for example, a semiconductor wafer, but it may be any of various other types of substrates (a glass substrate, a ceramic substrate, etc.) for use in the technical field of semiconductor device manufacturing. A supercritical drying technique has advantages when it is used to dry a substrate on which a fine pattern having a high aspect ratio is formed, as surface tension that may cause a pattern collapse does not act on the pattern in this technique.

In the following, in order to ease the explanation of directions and positions, an XYZ orthogonal coordinate system is set, and description will be made with reference to the coordinate system as necessary. Further, it should be noted that the X direction will sometimes be referred to as a front-back direction (with the positive X direction set as the front); the Y direction, as a left-right direction (with the positive Y direction set as the left); and the Z direction, as an up-down direction (with the positive Z direction set as the upside).

Figure 2:
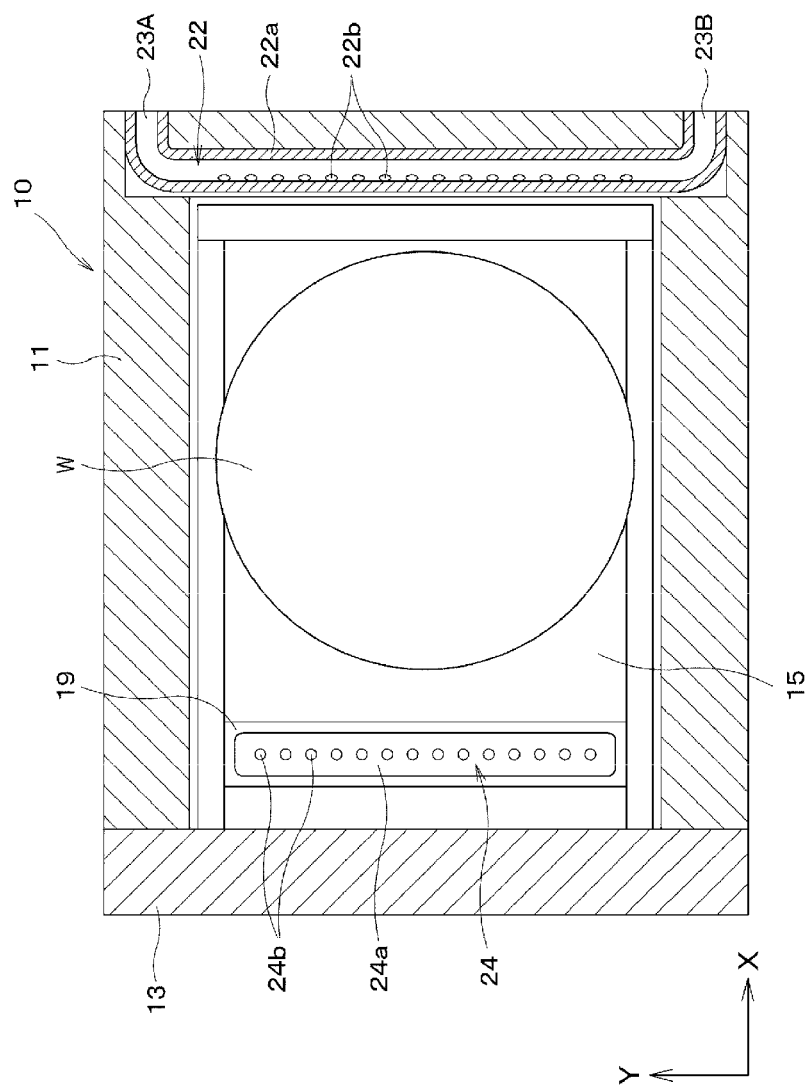
FIG. 2 is a schematic transversal sectional view of the processing unit shown in FIG. 1.

As depicted in FIG. 1 and FIG. 2, the supercritical drying apparatus is equipped with a processing unit 10. The supercritical drying processing is performed in the processing unit 10. The processing unit 10 includes a processing vessel 11 and a substrate holding tray 12 (hereinafter, simply referred to as a "tray 12") configured to hold the substrate W within the processing vessel 11.

In an exemplary embodiment, the tray 12 includes a cover 13 configured to close an opening provided at a sidewall of the processing vessel 11, and a substrate holder 14 connected to the cover 13 and extending in a horizontal direction. The substrate holder 14 has a plate 15 and a plurality of supporting pins 16 provided on a top surface of the plate 15. The substrate W is horizontally placed on the supporting pins 16 with the front surface (a surface on which a device or a pattern is formed) facing upwards. When the substrate W is placed on the supporting pins 16, a gap 17 is formed between the top surface of the plate 15 and a bottom surface (rear surface) of the substrate W.

The plate 15 is of, for example, a rectangular or square shape as a whole. An area of the plate 15 is larger than that of the substrate W, and when the substrate W is placed at a preset position on the substrate holder 14, the substrate W is completely covered with the plate 15 when the plate 15 is viewed from directly below it.

A plurality of through holes 18 are formed through the plate 15 in a vertical direction. The plurality of through holes 18 serve to introduce the processing fluid supplied to a space below the plate 15 into a space above the plate 15. Some of the plurality of through holes 18 also serve to allow lift pins (not shown), which are configured to deliver the substrate W between the substrate holder 14 and a substrate transfer mechanism (not shown) provided outside the processing unit 10, to pass therethrough. In the present specification, however, description of this structure will be omitted.

The tray 12 (an assembly of the cover 13 and the substrate holder 14) is configured to be moved by a non-illustrated tray moving mechanism between a processing position (closing position shown in FIG. 1 and FIG. 2) and a substrate transfer position (non-illustrated opening position) in the horizontal direction (X direction).

At the processing position of the tray 12, the substrate holder 14 is located in an internal space of the processing vessel 11, and the cover 13 closes the opening of the sidewall of the processing vessel 11. At the substrate transfer position of the tray 12, the substrate holder 14 is located outside the processing vessel 11, and the substrate W can be transferred between the substrate holder 14 and a non-illustrated substrate transfer arm via the aforementioned non-illustrated lift pins.

When the tray 12 is placed at the processing position, the internal space of the processing vessel 11 is divided by the plate 15 into an upper space 11A above the plate 15, where the substrate W is present during a processing, and a lower space 11B below the plate 15. However, the upper space 11A and the lower space 11B are not completely separated.

That is, in the shown exemplary embodiment, the upper space 11A and the lower space 11B communicate with each other through the aforementioned through holes 18 and an elongated hole 19 (which is also a through hole) provided near a connection portion between the plate 15 and the cover 13. The upper space 11A and the lower space 11B are also in communication with each other through a gap between a periphery portion of the plate 15 and an inner wall surface of the processing vessel 11. The gap, the through holes 18 and the elongated hole 19 described above may constitute a communication path through which the upper space 11A and the lower space 11B communicate with each other.

As described above, if the internal space of the processing vessel 11 is divided into the upper space 11A and the lower space 11B, and, also, if there is provided the communication path through which the upper space 11A and the lower space 11B are allowed to communicate with each other, a substrate placing table (substrate holder) immovably fixed to the processing vessel 11 may be provided instead of the tray 12 which is movable. In this case, in the state that a non-illustrated cover provided at the processing vessel 11 is opened, the non-illustrated substrate transfer arm advances into a vessel main body, and the substrate W is delivered between the substrate placing table and the substrate transfer arm.

The processing vessel 11 is provided with a first discharge unit 21 and a second discharge unit (fluid discharge unit) 22. The first discharge unit 21 and the second discharge unit 22 are configured to discharge the processing fluid (herein, carbon dioxide (also referred to as "$CO_2$" for simplicity)) supplied from a source 30 of the supercritical fluid (processing fluid in the supercritical state) into the internal space of the processing vessel 11.

The first discharge unit 21 is provided to be located under the plate 15 of the tray 12 at the processing position. The first discharge unit 21 discharges the $CO_2$ (processing fluid) into the lower space 11B toward a bottom surface of the plate 15 (upwards). The first discharge unit 21 may be a through hole formed through a bottom wall of the processing vessel 11. Alternatively, the first discharge unit 21 may be a nozzle body provided in the bottom wall of the processing vessel 11.

The second discharge unit 22 is provided to be positioned in front (positive X direction) of the substrate W disposed on the substrate holder 14 of the tray 12 at the processing position. The second discharge unit 22 supplies the $CO_2$ into the upper space 11A. In the shown exemplary embodiment, the second discharge unit 22 is provided in a sidewall of the processing vessel 11 opposite to the cover 13.

The second discharge unit 22 is configured as a rod-shaped nozzle body. To elaborate, the second discharge unit 22 is formed by drilling a plurality of discharge openings 22b in a tube 22a extending in a widthwise direction (Y direction) of the substrate W. For example, the plurality of discharge openings 22b are arranged at an equal distance therebetween in the Y direction. Each discharge opening 22b faces obliquely downwards so as to discharge the $CO_2$ toward an inclined surface 15a formed at a leading end (a front end farthest from the cover 13) of the plate 15. Further, the height of the topmost portion of the inclined surface 15a is lower than the front surface of the substrate W, and the inclined surface 15a slopes so that it becomes higher as it approaches the substrate W.

The processing vessel 11 is further provided with a fluid drain unit 24 configured to drain the processing fluid from the internal space of the processing vessel 11. The fluid drain unit 24 is configured as a header having substantially the same configuration as that of the second discharge unit 22. To elaborate, the fluid drain unit 24 is formed by drilling a plurality of outlet openings 24b in a tube 24a extending in the horizontal direction. The plurality of outlet openings 24b are arranged at an equal distance therebetween in the Y direction, for example. Each outlet opening 24b faces upwards, oriented toward the elongated hole 19 of the plate 15.

The second discharge unit 22 and the fluid drain unit 24 may be provided at any positions as long as the $CO_2$ supplied into the processing vessel 11 from the second discharge unit 22 can be drained from the fluid drain unit 24 after passing through a region above substantially the entire front surface of the substrate W in a substantially horizontal direction. For example, the second discharge unit 22 and the fluid drain unit 24 may be disposed on both sides of the substrate W in the left-right direction (that is, both sides in the Y direction) with the substrate W interposed therebetween.

Now, a supply/drain system configured to perform the supplying/draining of the $CO_2$ to/from the processing vessel 11 in the supercritical drying apparatus will be described with reference to a pipeline system diagram of FIG. 3. Further, the supply/drain system of the supercritical drying apparatus is equipped with branch lines (a line for recovering the processing fluid, a line for purging, etc.), valves, orifices, filters, sensors, and so forth, other than those shown in FIG. 3. However, description of components that are not directly related to the essence of the subject matter will be omitted here.

The supercritical drying apparatus has a supercritical fluid supply device 30 as a source 30 of the supercritical processing fluid (supercritical $CO_2$). The supercritical fluid supply device 30 has a commonly-known configuration including, for example, a carbon dioxide gas cylinder, a booster pump, a heater, and so forth. The supercritical fluid supply device 30 has an ability to force-feed the supercritical $CO_2$ at a pressure exceeding a supercritical state guarantee pressure (specifically, about 16 MPa) to be described later.

A main supply line 32 is connected to the supercritical fluid supply device 30. The $CO_2$ is flown out from the supercritical fluid supply device 30 into the main supply line 32 in the supercritical state, and this $CO_2$ may be turned into a gaseous state as a result of expansion or temperature change that occurs afterwards. In the present specification, a member called a "line" may be composed of, by way of example, a pipe (pipeline member).

The main supply line 32 is branched off into a first supply line 34 and a second supply line 36 at a branch point (first branch point) 33. The first supply line 34 is connected to the first discharge unit 21 of the processing vessel 11.

The second supply line 36 is further branched off into a first sub-supply line 36A and a second sub-supply line 36B at a branch point 36J located downstream of the first branch point 33. The first sub-supply line 36A is connected to a first end (connection portion) 23A of the tube 22a forming the second discharge unit 22, and the second sub-supply line 36B is connected to a second end (connection portion) 23B of the tube 22a. The first sub-supply line 36A and the second sub-supply line 36B are provided with an opening/closing valve V1A and an opening/closing valve V1B as supply flow control devices, respectively.

A drain line 38 is connected to the fluid drain unit 24 of the processing vessel 11. Specifically, a first sub-drain line 38A is connected to a first end (connection portion) 25A of the tube 24a forming the fluid drain unit 24, and a second sub-drain line 38B is connected to a second end (connection portion) 25B of the tube 24a. The reference numerals 25A and 25B are shown in FIG. 3 only. The first sub-drain line 38A and the second sub-drain line 38B are provided with an opening/closing valve V2A and an opening/closing valve V2B as drain flow control devices, respectively. The first sub-drain line 38A and the second sub-drain line 38B merge at a junction 38J to become the single drain line 38.

A combination of the "supply flow control device" and the "drain flow control device" is also referred to as "flow control device".

The drain line 38 is provided with a pressure sensor 39 near the junction 38J. A pressure detected by the pressure sensor 39 may be regarded as being identical to an internal pressure of the processing vessel 11. The pressure sensor 39 may be provided in each of the first and second sub-drain lines 38A and 38B.

The drain line 38 is provided with a pressure control valve 40. By adjusting an opening degree of the pressure control valve 40, a primary pressure of the pressure control valve 40 can be adjusted, and, thus, the internal pressure of the processing vessel 11 can be adjusted. In addition, by adjusting the opening degree of the pressure control valve 40, a drain rate of the processing fluid from the processing vessel 11 can also be adjusted.

It is desirable that the first sub-supply line 36A, the second sub-supply line 36B, the opening/closing valve V1A, and the opening/closing valve V1B are substantially symmetrical bilaterally (for example, with respect to an axis of symmetry extending in the X direction while passing through a center of the substrate W when viewed from the top). With this configuration, a flow resistance (which is decided by, for example, an inner dimeter and a length of a tube) from the branch point 36J to the first end 23A of the tube 22a and a flow resistance from the branch point 36J to the second end 23B of the tube 22a become substantially identical. Moreover, it is desirable that the shape of the second discharge unit 22 and the layout of the discharge openings 22b are also set to be bilaterally symmetrical.

Likewise, it is desirable that the first sub-drain line 38A, the second sub-drain line 38B, the opening/closing valve V2A, and the opening/closing valve V2B are also arranged in substantially bilateral symmetry. With this configuration, a flow resistance from the first end 25A of the tube 24a to the junction 38J and a flow resistance from the second end 25B of the tube 24a to the junction 38J become substantially identical. Furthermore, it is desirable that the shape of the fluid drain unit 24 and the layout of the outlet openings 24b are also set to be bilaterally symmetrical.

Figure 3:
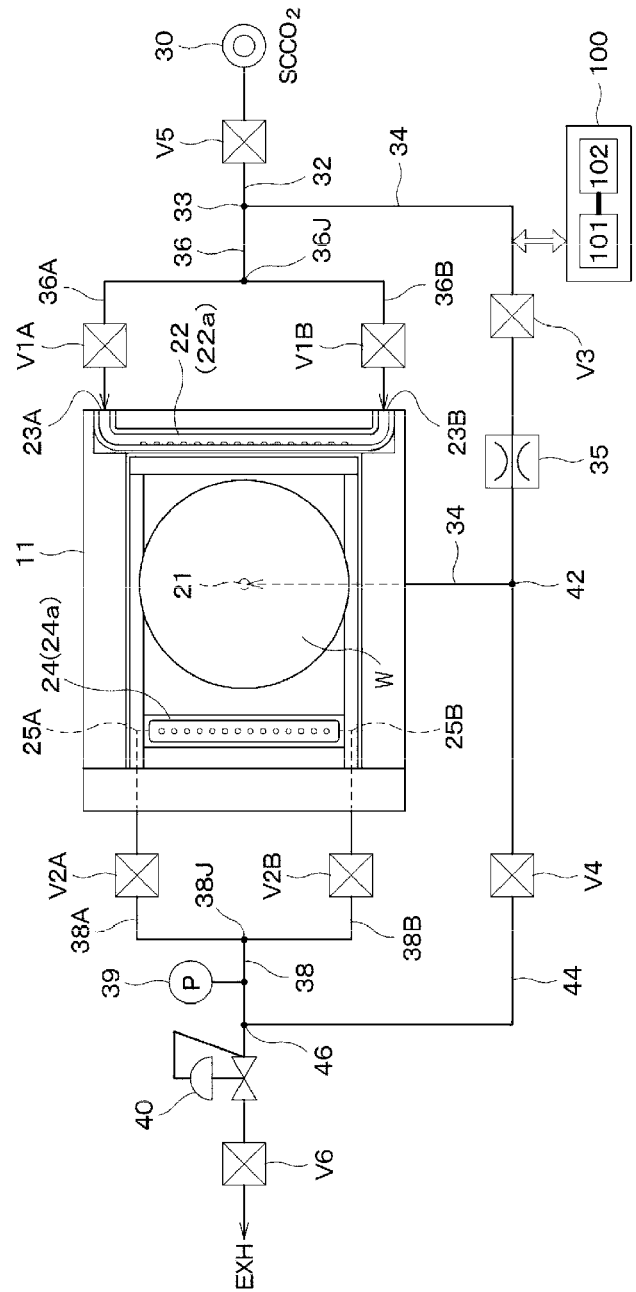
FIG. 3 is a schematic pipeline system diagram illustrating a pipeline system including the processing unit shown in FIG. 1.

The controller 100 schematically shown in FIG. 3 performs a feedback control over the opening degree of the pressure control valve 40 (specifically, a position of a valve main body) based on a deviation between a measurement value PV and a set value SV of the internal pressure of the processing vessel 11 to maintain the internal pressure of the processing vessel 11 at the set value. As the measurement value of the internal pressure of the processing vessel 11, a value detected by the pressure sensor 39 provided in the drain line 38 may be used. The internal pressure of the processing vessel 11 may be directly measured by a pressure sensor provided in the processing vessel 11. Further, the pressure control valve 40 may be set to have a fixed opening degree (without being feedback-controlled) based on an instruction value from the controller 100.

The controller 100 is implemented by, for example, a computer, and includes an operation unit 101 and a storage 102. The storage 102 stores therein a program for controlling various kinds of processings performed in the supercritical drying apparatus (or the substrate processing system including the supercritical drying apparatus). The operation unit 101 controls the operation of the supercritical drying apparatus by reading and executing the program stored in the storage 102 so that the operation defined in a processing recipe stored in the storage 102 is carried out. The program may be recorded on a computer-readable recording medium and installed from this recording medium to the storage 102 of the controller 100. The computer-readable recording medium may be, by way of non-limiting example, a hard disk (HD), a flexible disk (FD), a compact disk (CD), a magnet optical disk (MO), a memory card, or the like.

A bypass line 44 is branched off from the first supply line 34 at a branch point 42 set on the first supply line 34. The bypass line 44 is connected to the drain line 38 at a connection point (junction) 46 set on the drain line 38. The connection point 46 is located upstream of the pressure control valve 40.

The first supply line 34 is provided with an opening/closing valve V3 and an orifice 35, and the bypass line 44 is provided with an opening/closing valve V4.

At the upstream of the branch point 33, the main supply line 32 is provided with an opening/closing valve V5. At the downstream of the pressure control valve 40, the drain line 38 is provided with an opening/closing valve V6.

Now, an example of a supercritical drying method (substrate processing method) using the above-described supercritical drying apparatus will be described with reference to FIG. 4A to FIG. 4D. The sequence to be described below is automatically executed under the control of the controller 100 based on the processing recipe and the control program stored in the storage 102. In FIG. 4A to FIG. 4D, the opening/closing valves colored in gray are closed, and the opening/closing valves that are not colored are opened.

<Carry-In Process>

In the state that a recess of a pattern formed on the front surface of the substrate W, such as a semiconductor wafer, is filled with IPA and a puddle (liquid film) of the IPA is formed on the front surface of the substrate W, the substrate W is placed by the non-illustrated substrate transfer arm on the substrate holder 14 of the tray 12 which is standing by at the substrate transfer position. Further, the substrate W is previously subjected to (1) a chemical liquid processing such as wet etching or chemical liquid cleaning, (2) a rinse processing of washing the chemical liquid away by a rinse liquid, and (3) an IPA replacement processing of replacing the rinse liquid with the IPA to form the puddle (liquid film) of the IPA in sequence in a non-illustrated single sheet type cleaning apparatus. If the tray 12 having the substrate W placed thereon is moved to the processing position, a sealed processing space is formed within the processing vessel 11, and the substrate W is located within the processing space.

<Pressure Raising Process>

Subsequently, a pressure raising process is performed. Further, the opening/closing valve V5 is kept open until the end of the supercritical drying processing after the beginning of the pressure raising process. In addition, the opening/closing valve V6 may be kept open and be closed only in the pressure raising process. Hereinafter, unless particularly necessary, the opening/closing valves V5 and V6 will be no more mentioned.

Figure 4A:
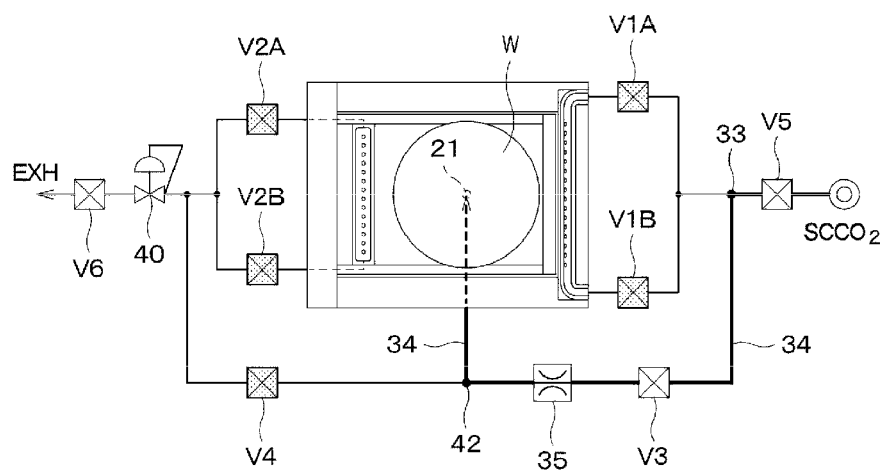
FIG. 4A is a diagram of describing an operation of the supercritical drying apparatus in FIG. 1, which illustrates a pressure increasing process.

First, as depicted in FIG. 4A, the opening/closing valve V3 is opened, and the opening/closing valves V1A, V1B, V2A, V2B, and V4 are closed. Accordingly, the $CO_2$ sent in the supercritical state from the supercritical fluid supply device 30 to the main supply line 32 passes through the branch point 33 to be introduced into the first supply line 34 provided with the orifice 35, and is then flown into the processing vessel 11 through the first discharge unit 21. As a result, the $CO_2$ is filled in the processing vessel 11, and the internal pressure of the processing vessel 11 rises relatively gently.

In the initial stage of the pressure raising process, since the internal pressure of the processing vessel 11 is low (atmospheric pressure), the $CO_2$ discharged from the first discharge unit 21 is turned into a gaseous state and its flow rate is increased. If this high-velocity flow of the $CO_2$ collides with the front surface of the substrate W, collapse (local evaporation or agitation) of the IPA puddle occurs, which may cause pattern collapse. However, the $CO_2$ discharged from the first discharge unit 21 into the lower space 11B of the processing vessel 11 is introduced into the upper space 11A through the through holes 18 of the plate 15, the elongated hole 19, the gap between the plate 15 and the inner wall surface of the processing vessel 11, and so forth after colliding with the bottom surface of the plate 15. Thus, the high-velocity flow of the $CO_2$ does not collide with the front surface of the substrate W.

In the initial stage of the pressure raising process, by opening the opening/closing valve V4 and, also, by opening the pressure control valve 40 to a small opening degree (fixed opening degree), some of the $CO_2$ flowing through the first supply line 34 may be sent into the drain line 38 through the bypass line 44. By doing so, the inflow rate of the $CO_2$ into the processing vessel 11 in the initial stage of the pressure raising process can be made smaller. In this case, the opening/closing valve V4 is closed at an appropriate timing.

If the internal pressure of the processing vessel 11 exceeds a threshold pressure (about 8 MPa) of the $CO_2$, the $CO_2$ ($CO_2$ not mixed with IPA) existing in the processing vessel 11 is turned into the supercritical state. Once the $CO_2$ in the processing vessel 11 is turned into the supercritical state, the IPA on the substrate W starts to be dissolved in the supercritical $CO_2$.

The pressure raising process lasts until the internal pressure of the processing vessel 11 reaches a pressure (supercritical state guarantee pressure) at which a mixed fluid ($CO_2$+IPA) on the substrate W is guaranteed to be maintained in the supercritical state regardless of a concentration of the IPA in the mixed fluid and a temperature of the mixed fluid. The supercritical state guarantee pressure is approximately 16 MPa.

<Flowing Process>

Upon the completion of the pressure raising process, a flowing process is performed. In the flowing process, the $CO_2$ is discharged into the processing vessel 11 from the second discharge unit 22, and the $CO_2$ (this includes the IPA) is drained from the fluid drain unit 24. Accordingly, a flow directed from the second discharge unit 22 to the fluid drain unit 24 is generated in the processing vessel 11 (see arrows in FIG. 1). Specifically, a laminar flow of the supercritical $CO_2$ flowing substantially in parallel with the front surface of the substrate W (substantially in the horizontal direction) is formed. The IPA in the mixed fluid (IPA+$CO_2$) on the front surface of the substrate W exposed to the laminar flow of the supercritical $CO_2$ is replaced by the supercritical $CO_2$. Finally, all or almost all of the IPA existing on the front surface of the substrate W is replaced by the supercritical $CO_2$. Further, in the flowing process, the opening/closing valves V3 and V4 are kept closed, so the $CO_2$ is not supplied into the processing vessel 11 from the first discharge unit 21.

The mixed fluid composed of the IPA and the supercritical $CO_2$ drained from the fluid drain unit 24 is collected at the downstream of the drain line 38. The IPA included in the mixed fluid can be separated and reused.

During the flowing process, the pressure control valve 40 provided in the drain line 38 is operated in a feedback control mode. That is, the controller 100 (or a sub-controller thereof) performs a feedback control over the opening degree (manipulation amount MV) of the pressure control valve 40 based on a difference between the internal pressure (measurement value PV) of the processing vessel 11 detected by the pressure sensor 39 and the set value SV such that the internal pressure of the processing vessel 11 is maintained at the set value (set value SV=16 MPa). This pressure control is performed in the same manner in any of flow modes to be described below.

In the flowing process, the $CO_2$ is discharged obliquely downwards from each discharge opening 22b toward the inclined surface 15a formed at the leading end of the plate 15 (the front end farthest from the cover 13). Then, the $CO_2$ is diverted by the inclined surface 15a, and flows toward a space above the substrate W. For the reason, the flow of the supercritical $CO_2$ does not directly collide with the liquid film of the IPA of the mixed fluid on the front surface of the substrate W, and is allowed to flow near and along the liquid film more smoothly. Although the above-described configuration is desirable, each discharge opening 22b may be configured to discharge the $CO_2$ in the horizontal direction (negative X direction).

The flowing process may be performed by combining several (for example, three) flow modes appropriately. In the flowing process, each flow mode is implemented by changing the state of the opening/closing valves V1A, V1B, V2A and V2B appropriately while keeping the opening/closing valves V3 and V4 closed. Between the different flow modes, a flow velocity distribution of the $CO_2$ in the horizontal direction or a flow direction distribution of the $CO_2$ in the horizontal direction, which flows above the substrate W in the substantially horizontal direction within the processing vessel 11, is different.

(Flow Mode 1 (First Flow Mode))

Figure 4B:
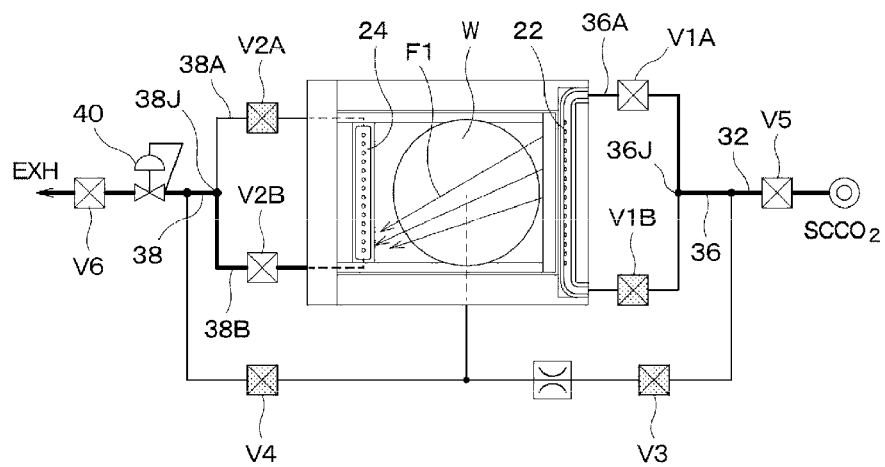
FIG. 4B is a diagram of describing an operation of the supercritical drying apparatus in FIG. 1, which illustrates a first flow mode of a flowing process.

In a first flow mode, the opening/closing valves V1B and V2A are closed and the opening/closing valves V1A and V2B are opened, as shown in FIG. 4B. Accordingly, the $CO_2$ flown through the main supply line 32 from the supercritical fluid supply device 30 is introduced into the second supply line 36 after passing through the branch point 33, and is then flown into the second discharge unit 22 through the first sub-supply line 36A after passing through the branch point 36J. No $CO_2$ is introduced into the second discharge unit 22 from the second sub-supply line 36B.

For this reason, there is formed a discharge flow rate distribution in which a discharge flow rate of the $CO_2$ from the discharge opening 22b closest to the first end 23A of the second discharge unit 22 into the processing vessel 11 is the highest, and a discharge flow rate of the $CO_2$ from the discharge opening 22b farthest from the first end 23A is the lowest.

Further, the $CO_2$ (which contains the IPA) is drained from the processing vessel 11 via the second sub-drain line 38B, whereas no $CO_2$ is drained via the first sub-drain line 38A.

For this reason, there is generated a drain flow rate distribution in which a drain flow rate of the $CO_2$ from the outlet opening 24b closest to the second end 25B of the fluid drain unit 24 is the highest, and a drain flow rate of the $CO_2$ from the outlet opening 24b farthest from the second end 25B is the lowest.

Because of the discharge flow rate distribution and the drain flow rate distribution described above, a flow distribution of the $CO_2$ mainly flowing from the first end 23A side of the second discharge unit 22 toward the second end 25B side of the fluid drain unit 24 is formed, when viewed from the top. In FIG. 4B, this mainstream is schematically indicated by an arrow F1. A vector of the mainstream F1 has a negative Y-direction component. Further, in the present specification, the expression "when viewed from the top" means viewing the substrate W from a direction normal to the front surface of substrate W (especially from above it).

(Flow Mode 2 (Second Flow Mode))

Figure 4C:
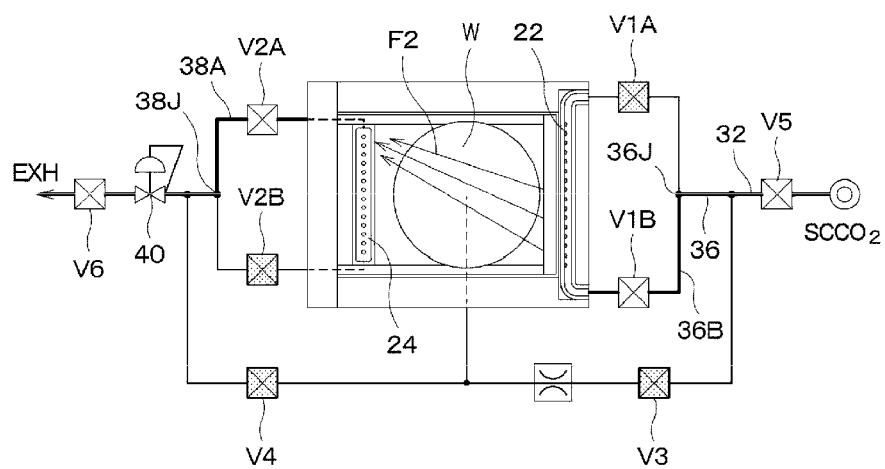
FIG. 4C is a diagram of describing an operation of the supercritical drying apparatus in FIG. 1, which illustrates a second flow mode of the flowing process.

In a second flow mode, the opening/closing valves V1A and V2B are closed, and the opening/closing valves V1B and V2A are opened, as illustrated in FIG. 4C. In this case, when viewed from the top, a flow distribution of the $CO_2$ mainly flowing from the second end 23B side of the second discharge unit 22 toward the first end 25A side of the fluid drain unit 24 is formed. That is, when viewed from the top, the flow distribution in the first flow mode and the flow distribution in the second flow mode are symmetrical (in mirror symmetry) with respect to a straight line extending in the X-axis direction and passing through the center of the substrate W. In FIG. 4C, the mainstream in the second flow mode is schematically indicated by an arrow F2. A vector of the mainstream F2 has a positive Y-direction component.

(Flow Mode 3 (Third Flow Mode))

Figure 4D:
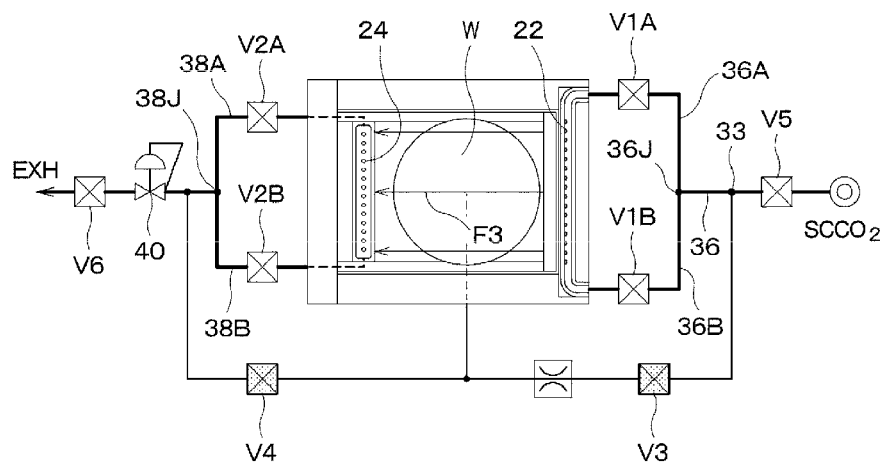
FIG. 4D is a diagram of describing an operation of the supercritical drying apparatus in FIG. 1, which illustrates a third flow mode of the flowing process.

In a third flow mode, the opening/closing valves V1A, V1B, V2A and V2B are opened. In this case, the $CO_2$ is introduced into the second discharge unit 22 substantially equally from the first end 23A and the second end 23B. Further, flow rates of the $CO_2$ drained from the first end 25A and the second end 25B of the fluid drain unit 24 are also substantially equal. For this reason, discharge flow rates of the $CO_2$ from the respective discharge openings 22b of the second discharge unit 22 into the processing vessel 11 become substantially equal, and drain flow rates of the $CO_2$ passing through the respective outlet openings 24b of the fluid drain unit 24 become substantially equal, too. Accordingly, there is formed a flow distribution of the $CO_2$ substantially in parallel with the X direction when viewed from the top. In FIG. 4D, this mainstream is schematically indicated by an arrow F3. A vector of the mainstream F3 substantially does not have any Y-direction component.

The flowing process may be carried out by performing a set consisting of the first flow mode and the second flow mode alternately once or more than once. After repeating the set consisting of the first flow mode and the second flow mode once or more than once, the third flow mode may be performed. In the flowing process, it is desirable that a processing time of a single cycle of the first flow mode and a processing time of a single cycle of the second flow mode are same. In this case, it is desirable that the repetition number of the first flow mode and the repetition number of the second flow mode are same.

However, it may be also possible that the processing time (repetition number) of the first flow mode is different from the processing time (repetition number) of the second flow mode. As an example reason therefor, the processing vessel 11 and the pipelines around it cannot be said to be completely symmetrical due to a machine difference, for example.

The first flow mode may be modified as follows. By way of example, in a flow mode 1' (first modification example of the first flow mode), the opening/closing valves V1A, V1B and V2B may be opened, whereas the opening/closing valve V2A may be closed. In this case, a vector of a mainstream has a negative Y-direction component as in the flow mode 1, but the magnitude of the negative Y-direction component is reduced.

In a flow mode 1'' (second modification example of the first flow mode), the opening/closing valve V1A may be opened, whereas the opening/closing valves V1B, V2A, and V2B may be closed. In this case, a vector of a mainstream has a negative Y-direction component as in the first flow mode, but the magnitude of the negative Y-direction component is reduced.

Likewise, the second flow mode may be modified. By way of example, in a flow mode 2' (first modification example of the second flow mode), the opening/closing valves V1A, V1B, and V2A may be opened, whereas the opening/closing valve V2B may be closed. In this case, a vector of a mainstream has a positive Y-direction component as in the second flow mode, but the magnitude of the positive Y-direction component is reduced.

In a flow mode 2'' (second modification example of the second flow mode), the opening/closing valve V1B may be opened, whereas the opening/closing valves V1A, V2A, and V2B may be closed. In this case, a vector of a mainstream has a positive Y-direction component as in the second flow mode, but the magnitude of the positive Y-direction component is reduced.

In the above description, it is desirable to combine the same modification examples. That is, it is desirable to combine the flow mode 1' (first modification example) and the flow mode 2' (first modification example) to form a set, and to combine the flow mode 1'' (second modification example) and the flow mode 2'' (second modification example) to form a set. That is, it is desirable that the directions of the Y-direction components of the vectors of the mainstreams in the flow modes constituting the set are opposite to each other while the magnitudes are substantially equal to each other.

[Draining Process]

Upon the completion of the replacement of the IPA on the substrate W with the supercritical $CO_2$, the opening/closing valves V1A and V1B are closed to stop the supply of the $CO_2$ into the processing vessel 11, and both of the opening/closing valves V2A and V2B are opened to reduce the set pressure of the processing vessel 11 to a normal pressure. Accordingly, the opening degree of the pressure control valve 40 is greatly increased (for example, the pressure control valve is fully opened), so that the internal pressure of the processing vessel 11 gets reduced to the normal pressure. As a result, the supercritical $CO_2$ present within the pattern of the substrate W becomes a gas and is released from the inside of the pattern, and the gaseous $CO_2$ is drained from the processing vessel 11 via the first sub-drain line 38A, the second sub-drain line 38B, and the drain line 38. Finally, the opening/closing valve V4 of the bypass line 44 is opened to drain the $CO_2$ remaining between the opening/closing valve V3 and the opening/closing valve V4. Through the above-described processes, the drying of the substrate W is completed.

[Carry-Out Process]

The substrate holder 14 of the tray 12 on which the dried substrate W is placed is taken out of the processing vessel 11 and moved to the substrate transfer position. The substrate W is taken out from the substrate holder 14 by the non-illustrated substrate transfer arm, and is accommodated in a non-illustrated substrate processing vessel, for example.

Effects of Exemplary Embodiment

According to the above-described exemplary embodiment, it is possible to suppress particles from being left on the front surface of the substrate W after the completion of the drying processing. In particular, it is possible to suppress the particles from being left while being concentrated in a specific region on the front surface of the substrate W, for example (that is, it is possible to suppress a device in that region from becoming defective). This will be elaborated below.

In the initial stage of the pressure raising process, when the $CO_2$ is introduced into the processing vessel 11 at a high velocity, a particle-causing substance adhering to the rear surface of the substrate W, the inner wall surface of the processing vessel 11, the front surface of the substrate holder 14, and the inner wall surfaces of the first discharge unit 21 and the first supply line 34 may be peeled off to reach the front surface of the substrate W together with the $CO_2$ in some cases. The particle-causing substance having reached the front surface of the substrate W is mixed into the IPA liquid film on the front surface of the substrate W.

The following two models are assumed as a cause of the particles left in a specific region.

(Model 1)

It is assumed that the particle-causing substance reaches the front surface of the substrate W in a substantially uniform manner in the pressure raising process, and the flowing process is carried out through the above-described third flow mode only.

It is not always easy to form the processing vessel 11, the second discharge unit 22, the fluid drain unit 24, and the pipelines connected thereto completely symmetrically, and some asymmetry may occur. As a cause of this asymmetry, uniformity in the flow distribution in the left-right direction may not be achieved in some cases. By way of example, the flow velocity of the $CO_2$ flowing from the second discharge unit 22 toward the fluid drain unit 24 through the space above the substrate W may be high in a region on the right side of the processing vessel 11, and may be small in a region on the left side of the processing vessel 11.

When the particle-causing substance exists in the liquid film of the IPA (including the supercritical $CO_2$), the particle-causing substance is released from the processing vessel 11 along with the supercritical $CO_2$ flowing above the substrate W. If, however, the flow velocity of the $CO_2$ is not uniform as stated above, the release of the particle-causing substance may be stagnated in the region where the flow velocity of the $CO_2$ is small, and, as a result, a lot of particles may be left in the region where the flow velocity of the $CO_2$ is small.

(Model 2)

It is assumed that the particle-causing substance reach the front surface of the substrate W in a non-uniform manner (for example, more in the region on the right side of the processing vessel 11) in the pressure raising process, and the flow velocity distribution of the $CO_2$ is uniform in the left-right direction when the flowing process is carried out through the third flow mode only. In this case, more particles may be left in the region where the larger amount of particle-causing substance has reached.

According to the above-described exemplary embodiment, since the direction of the flow of the $CO_2$ flowing from the second discharge unit 22 to the fluid drain unit 24 during the flowing process is changed, the particle-causing substance is moved in the left-right direction (Y direction) when the flowing process is being performed (see FIG. 4B and FIG. 4C). Thus, by performing the first flow mode and the second flow mode alternately, the distribution of the particle-causing substance in the left-right direction becomes more uniform. Accordingly, it is possible to suppress the particles from locally remaining in a specific region. In addition, if the distribution of the particle-causing substance is uniform during the flowing process, the efficiency of the release of the particle-causing substance is also improved, so that the total amount of the particles can be reduced. That is, even if the particle problem is caused due to any of the mechanisms of the models 1 and 2, the problem can be solved.

As a modified exemplary embodiment of the processing unit, the following configuration may be adopted.

Figure 5:
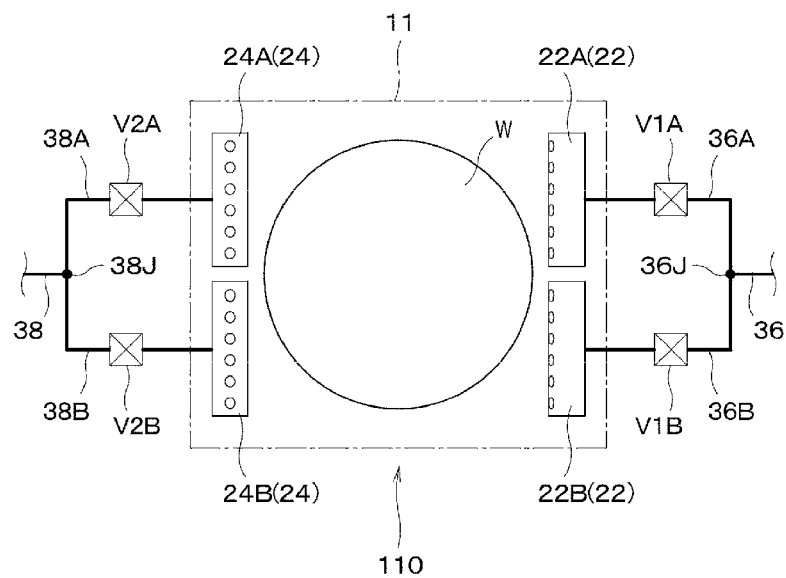
FIG. 5 is a schematic plan view illustrating main components of a first modification example of the processing unit.

FIG. 5 is a schematic diagram showing only the components involved in the flowing process in the processing unit 110 according to a first modified exemplary embodiment. Here, the second discharge unit 22 is divided into a plurality of, for example, two sub-elements 22A and 22B, and the first sub-supply line 36A and the second sub-supply line 36B are connected to the sub-elements 22A and 22B, respectively. Further, the fluid drain unit 24 is divided into a plurality of, for example, two sub-elements 24A and 24B, and the first sub-drain line 38A and the second sub-drain line 38B are connected to the sub-elements 24A and 24B, respectively. Furthermore, instead of the configuration example shown in FIG. 5, either one of the second discharge unit 22 or the fluid drain unit 24 may be configured as a single component, the same as in the above-described exemplary embodiment.

In this first modified exemplary embodiment as well, in the flowing process, the Y-direction component of the vector of the mainstream may be changed by operating the opening/closing valves V1A, V1B, V2A, and V2B in the same way as in the above-described flow mode or the modification examples thereof.

Figure 6:
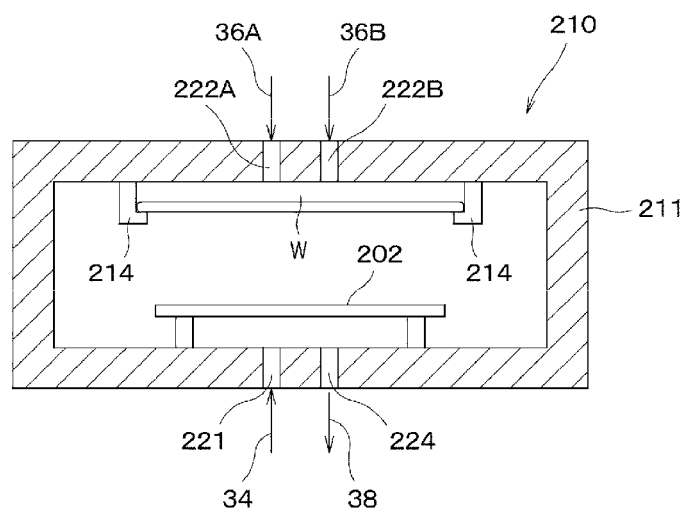
FIG. 6 is a schematic longitudinal sectional view illustrating a second modification example of the processing unit.

FIG. 6 is a schematic diagram illustrating a configuration of a processing unit 210 according to a second modified exemplary embodiment. The processing unit 210 shown in FIG. 6 is equipped with a processing vessel 211. A plurality of, for example, three substrate supports 214 (substrate holders) configured to support a substrate W from slightly below a ceiling wall of the processing vessel 211 are provided at this ceiling wall. Each substrate support 214 supports a periphery of a bottom surface of the substrate W from below. A baffle plate 202 having, for example, a disk shape is provided slightly above a bottom wall of the processing vessel 211.

A first discharge unit 221 and a fluid drain unit 224 are provided in the bottom wall of the processing vessel 211. The first discharge unit 221 and the fluid drain unit 224 are located directly under the baffle plate 202. Two second discharge units 222A and 222B are provided in the ceiling wall of the processing vessel 211. The first discharge unit 221, the second discharge units 222A and 222B, and the fluid drain unit 224 may be configured as holes formed in the walls (the bottom wall or the ceiling wall) of the processing vessel 211, or may be configured as pipes or nozzles inserted through these holes.

The processing unit 210 shown in FIG. 6 may be mounted to the pipeline system shown in FIG. 3. In this case, a downstream end of the first supply line 34 may be connected to the first discharge unit 221, and the two second discharge units 222A and 222B may be connected to downstream ends of the first sub-supply line 36A and the second sub-supply line 36B, respectively. Further, the fluid drain unit 224 may be connected to an upstream end of the drain line 38, and in this case, the drain line 38 need not be branched off into the first sub-drain line 38A and the second sub-drain line 38B.

In the processing unit 210 shown in FIG. 6 as well, it is possible to perform a pressure raising process, a flowing process, and a draining process in the same order as in the above-described exemplary embodiment. In particular, in the flowing process, the Y-direction component of the vector of the mainstream may be changed by operating the opening/closing valves V1A, V1B, V2A, and V2B in the same way as in the above-described flow mode or modification examples thereof.

In the pressure raising process, the $CO_2$ is discharged from the first discharge unit 221 into the processing unit 210. After colliding with the baffle plate 202, the discharged $CO_2$ flows along a bottom surface of the baffle plate 202 toward a periphery of the baffle plate 202, and then flows upwards. Therefore, in the pressure raising process, the $CO_2$ does not flow around the substrate W at a high velocity.

In the flowing process, the $CO_2$ is discharged from the second discharge units 222A and 222B alternately, for example. That is, the $CO_2$ is alternately discharged from the two discharge units, the same as in the exemplary embodiment of FIG. 5. At the same time, the $CO_2$ (which contains the IPA) is drained from the fluid drain unit 124.

Figure 7:
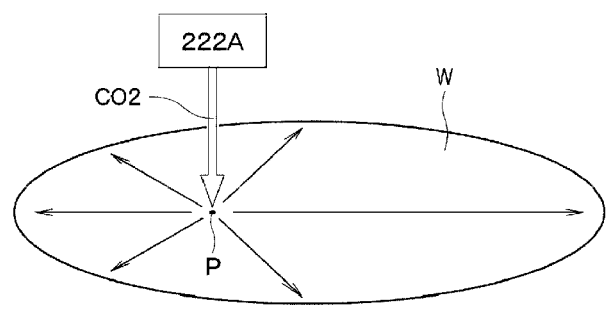
FIG. 7 is a schematic perspective view illustrating a flow of a processing fluid in the flowing process in the processing unit of FIG. 5.
Figure 7:
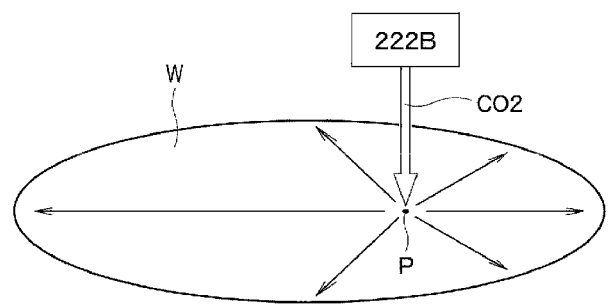

When the $CO_2$ is discharged from either one of the second discharge units 222A and 222B, the discharged $CO_2$ collides with a top surface (front surface) of the substrate W directly below it, and then flows toward a periphery of the substrate W along the front surface of the substrate W. At this time, as schematically shown in FIG. 7, the $CO_2$ discharged from the second discharge units 222A and 222B flows along the front surface of the substrate W to be diffused toward the periphery of the substrate with a collision point P onto the front surface of the substrate W as a center. In the two cases where the $CO_2$ is discharged from the second discharge unit 222A (mode 1) and where it is discharged from the second discharge unit 222B (mode 2), a position of the collision point P on the front surface of the substrate W and a flow distribution along the front surface of the substrate W are different. Furthermore, the flow distributions of the mode 1 and the mode 2 are mirror-symmetrical with respect to a straight line passing through a center of the substrate, when viewed from the top. Thus, in the flowing process, by discharging the $CO_2$ from the second discharging units 222A and 222B alternately, for example, the distribution of the particle-causing substance may be uniformed, and efficiency of the release of the particle-causing substance may be improved.

As a modified exemplary embodiment of the supply control device/drain control device provided in the supply/ drain system, a function of adjusting the opening degree of the opening/closing valves V1A, V1B, V2A and V2B may be provided. The opening/closing valve V1A and a valve (for example, a constant pressure valve) having a flow rate control function may be provided in series in the first sub-supply line 36A, and the opening/closing valve V1B and a valve having a flow rate control function may be provided in series in the second sub-supply line 36B. The opening/closing valve V2A and a valve having a flow rate control function may be provided in series in the first sub-drain line 38A, and the opening/closing valve V2B and a valve having a flow rate control function may be provided in series in the second sub-drain line 38B.

In the above-described first and second flow modes, by appropriately adjusting the opening degree of the valve having the flow rate control function without closing the opening/closing valve, it is possible to form a flow distribution in which a vector of a mainstream has a negative Y-direction component and a positive Y-direction component as described above. As a specific example, in the first flow mode, the opening degrees of the valves having the flow rate control function (opening degree adjusting function) and provided in the first and second sub-supply lines 36A and 36B may be adjusted so that a flow rate of the $CO_2$ flowing into the second discharge unit 22 from the first end 23A is relatively large, whereas a flow rate of the $CO_2$ flowing into the second discharge unit 22 from the second end 23B is relatively small. In the fluid drain unit 24 as well, it is possible to perform the same adjustment as described above by using the valves having the flow rate control function. Even in the second flow mode, it is possible to perform the same adjustment by using valves which has a flow rate control function.

It should be noted that the above-described exemplary embodiment is illustrative in all aspects and is not anyway limiting. The above-described exemplary embodiment may be omitted, replaced and modified in various ways without departing from the scope and the spirit of claims.

The substrate is not limited to the semiconductor wafer, and any of various other types of substrates for use in the manufacture of semiconductor devices, such as a glass substrate and a ceramic substrate, may be used.

According to the exemplary embodiment, it is possible to suppress the adhesion of the particle to the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method of drying a substrate, which has a liquid adhering to a surface thereof, by using a processing fluid in a supercritical state,
wherein the substrate processing method is performed by using a substrate processing apparatus,
the substrate processing apparatus comprises:
a processing vessel;
a substrate holder configured to hold the substrate horizontally within the processing vessel such that the surface of the substrate faces upwards;
a fluid discharge unit configured to discharge the processing fluid into the processing vessel;
a fluid drain unit configured to drain the processing fluid from the processing vessel;
a supply line, connected to the fluid discharge unit, through which the processing fluid is supplied to the fluid discharge unit from a fluid source configured to supply the processing fluid in the supercritical state;
a drain line connected to the fluid drain unit; and
a flow control device provided in at least one of the supply line or the drain line, and configured to control a flow of the processing fluid flowing within the processing vessel from the fluid discharge unit toward the fluid drain unit, and
wherein the fluid drain unit comprises a manifold having, between a first end and a second end thereof, multiple outlet openings arranged at a distance therebetween in a horizontal direction; the drain line comprises a first sub-drain line and a second sub-drain line connected to the first end and the second end of the manifold, respectively; each of the first sub-drain line and the second sub-drain line is provided with a drain flow control device; and the drain flow control device constitutes at least a part of the flow control device,
wherein the substrate processing method comprises: flowing the processing fluid from the fluid discharge unit to the fluid drain unit such that the processing fluid flows along the surface of the substrate held by the substrate holder,
the flowing of the processing fluid comprises flowing the processing fluid in a first flow mode in the processing vessel and flowing the processing fluid in a second flow mode in the processing vessel,
between the first flow mode and the second flow mode, a flow direction distribution of the processing fluid flowing along the surface of the substrate in the processing vessel is different when viewed from a direction normal to the surface of the substrate, and
a switchover between the first flow mode and the second flow mode is performed by the flow control device,
by using the drain flow control device, in the first flow mode, a drain flow rate of the processing fluid into the first sub-drain line through the manifold is set to be smaller than a drain flow rate of the processing fluid into the second sub-drain line through the manifold, and
by using the drain flow control device, in the second flow mode, a drain flow rate of the processing fluid into the first sub-drain line through the manifold is set to be larger than a drain flow rate of the processing fluid into the second sub-drain line through the manifold.

2. The substrate processing method of claim 1, wherein the flowing of the processing fluid in the first flow mode and the flowing of the processing fluid in the second flow mode are repeated alternately.

3. The substrate processing method of claim 1, wherein when viewed from the direction normal to the surface of the substrate, a flow of the processing fluid in the first flow mode and a flow of the processing fluid in the second flow mode intersect with each other.

4. The substrate processing method of claim 3,
wherein when viewed from the direction normal to the surface of the substrate, the flow direction distribution in the first flow mode and the flow direction distribution in the second flow mode are mirror-symmetrical with respect to a straight line passing through a center of the substrate.

5. The substrate processing method of claim 1,
wherein the fluid discharge unit comprises a nozzle body having, between a first end and a second end thereof, multiple discharge openings arranged at a distance therebetween in a horizontal direction; the supply line comprises a first sub-supply line and a second sub-supply line connected to the first end and the second end of the nozzle body, respectively; each of the first sub-supply line and the second sub-supply line is provided with a supply flow control device; and the supply flow control device constitutes at least a part of the flow control device,
by using the supply flow control device, in the first flow mode, a supply flow rate of the processing fluid from the first sub-supply line to the nozzle body is set to be larger than a supply flow rate of the processing fluid from the second sub-supply line to the nozzle body, and
by using the supply flow control device, in the second flow mode, a supply flow rate of the processing fluid from the first sub-supply line to the nozzle body is set to be smaller than a supply flow rate of the processing fluid from the second sub-supply line to the nozzle body.

6. The substrate processing method of claim 5,
wherein the supply flow control device provided in each of the first sub-supply line and the second sub-supply line is an opening/closing valve; in the first flow mode, the opening/closing valve of the first sub-supply line is opened whereas the opening/closing valve of the second sub-supply line is closed; and in the second flow mode, the opening/closing valve of the first sub-supply line is closed whereas the opening/closing valve of the second sub-supply line is opened.

7. The substrate processing method of claim 5,
wherein the supply flow control device provided in each of the first sub-supply line and the second sub-supply line is a valve with a variable opening degree; in the first flow mode, the opening degree of the valve of the first sub-supply line is set to be larger than the opening degree of the valve of the second sub-supply line; and in the second flow mode, the opening degree of the valve of the first sub-supply line is set to be smaller than the opening degree of the valve of the second sub-supply line.

8. The substrate processing method of claim 5,
wherein when viewed from the direction normal to the surface of the substrate, the nozzle body and the manifold are disposed to be opposite to each other with the substrate therebetween and in parallel to each other.

9. The substrate processing method of claim 1,
wherein the drain flow control device provided in each of the first sub-drain line and the second sub-drain line is an opening/closing valve; in the first flow mode, the opening/closing valve of the first sub-drain line is closed whereas the opening/closing valve of the second sub-drain line is opened; and in the second flow mode, the opening/closing valve of the first sub-drain line is opened whereas the opening/closing valve of the second sub-drain line is closed.

10. The substrate processing method of claim 1,
wherein the drain flow control device provided in each of the first sub-drain line and the second sub-drain line is a valve with a variable opening degree; in the first flow mode, the opening degree of the valve of the first sub-drain line is set to be smaller than the opening degree of the valve of the second sub-drain line; and in the second flow mode, the opening degree of the valve of the first sub-drain line is set to be larger than the opening degree of the valve of the second sub-drain line.

11. The substrate processing method of claim 1,
wherein the fluid discharge unit comprises a first discharging element and a second discharging element that are separately provided,
the supply line comprises a first sub-supply line and a second sub-supply line connected to the first discharging element and the second discharging element, respectively; each of the first sub-supply line and the second sub-supply line is provided with a supply flow control device; and the supply flow control device constitutes at least a part of the flow control device,
by using the supply flow control device, in the first flow mode, a supply flow rate of the processing fluid from the first sub-supply line to the first discharging element is set to be larger than a supply flow rate of the processing fluid from the second sub-supply line to the second discharging element, and
by using the supply flow control device, in the second flow mode, a supply flow rate of the processing fluid from the first sub-supply line to the first discharging element is set to be smaller than a supply flow rate of the processing fluid from the second sub-supply line to the second discharging element.

12. The substrate processing method of claim 1,
wherein the substrate processing apparatus further comprises a valve with a variable opening degree provided in the drain line and configured to control a pressure of the processing vessel, and
the flowing of the processing fluid in the first flow mode and the flowing of the processing fluid in the second flow mode are performed in a state that an inside of the processing vessel is maintained at a preset pressure by the valve.

13. The substrate processing method of claim 1,
wherein an inclined surface, which is inclined so as to become higher when approaching the substrate, is provided at a leading end of the substrate holder; the fluid discharge unit has multiple discharge openings through which the processing fluid is discharged toward the inclined surface; and, in the flowing of the processing fluid, the processing fluid discharged from the multiple discharge openings flows along the surface of the substrate held by the substrate holder after being diverted by the inclined surface.

14. A substrate processing method of drying a substrate, which has a liquid adhering to a surface thereof by using a processing fluid in a supercritical state,
wherein the substrate processing method is performed by using a substrate processing apparatus,
the substrate processing apparatus comprises:
a processing vessel;
a substrate holder configured to hold the substrate horizontally within the processing vessel such that the surface of the substrate faces upwards;
a fluid discharge unit configured to discharge the processing fluid into the processing vessel;

a fluid drain unit configured to drain the processing fluid from the processing vessel;

a supply line, connected to the fluid discharge unit, through which the processing fluid is supplied to the fluid discharge unit from a fluid source configured to supply the processing fluid in the supercritical state;

a drain line connected to the fluid drain unit; and a flow control device provided in at least one of the supply line or the drain line, and configured to control a flow of the processing fluid flowing within the processing vessel from the fluid discharge unit toward the fluid drain unit, and wherein the fluid drain unit comprises a first draining element and a second draining element that are separately provided, the drain line comprises a first sub-drain line and a second sub-drain line connected to the first draining element and the second draining element, respectively; each of the first sub-drain line and the second sub-drain line is provided with a drain flow control device; and the drain flow control device constitutes at least a part of the flow control device, wherein the substrate processing method comprises: flowing the processing fluid from the fluid discharge unit to the fluid drain unit such that the processing fluid flows along the surface of the substrate held by the substrate holder, the flowing of the processing fluid comprises flowing the processing fluid in a first flow mode in the processing vessel and flowing the processing fluid in a second flow mode in the processing vessel, between the first flow mode and the second flow mode, a flow direction distribution of the processing fluid flowing along the surface of the substrate in the processing vessel is different when viewed from a direction normal to the surface of the substrate, a switchover between the first flow mode and the second flow mode is performed by the flow control device, by using the drain flow control device, in the first flow mode, a drain flow rate of the processing fluid from the first draining element to the first sub-drain line is set to be smaller than a drain flow rate of the processing fluid from the second draining element to the second sub-drain line, and by using the drain flow control device, in the second flow mode, a drain flow rate of the processing fluid from the first draining element to the first sub-drain line is set to be larger than a drain flow rate of the processing fluid from the second draining element to the second sub-drain line.

15. A substrate processing apparatus configured to dry a substrate, which has a liquid adhering to a surface thereof, by using a processing fluid in a supercritical state, the substrate processing apparatus comprising:

a processing vessel;

a substrate holder configured to hold the substrate horizontally within the processing vessel such that the surface of the substrate faces upwards;

a fluid discharge unit configured to discharge the processing fluid into the processing vessel;

a fluid drain unit configured to drain the processing fluid from the processing vessel;

a supply line, connected to the fluid discharge unit, through which the processing fluid is supplied to the fluid discharge unit from a fluid source configured to supply the processing fluid in the supercritical state;

a drain line connected to the fluid drain unit;

a flow control device provided in at least one of the supply line or the drain line, and configured to control a flow of the processing fluid flowing within the processing vessel from the fluid discharge unit toward the fluid drain unit; and a controller configured to control an operation of the flow control device, wherein the fluid drain unit comprises a manifold having, between a first end and a second end thereof, multiple outlet openings arranged at a distance therebetween in a horizontal direction; the drain line comprises a first sub-drain line and a second sub-drain line connected to the first end and the second end of the manifold, respectively; each of the first sub-drain line and the second sub-drain line is provided with a drain flow control device; and the drain flow control device constitutes at least a part of the flow control device, wherein the controller is configured to perform a substrate processing method comprising:

flowing the processing fluid from the fluid discharge unit to the fluid drain unit such that the processing fluid flows along the surface of the substrate held by the substrate holder, the flowing of the processing fluid comprises flowing the processing fluid in a first flow mode in the processing vessel and flowing the processing fluid in a second flow mode in the processing vessel, between the first flow mode and the second flow mode, a flow direction distribution of the processing fluid flowing along the surface of the substrate in the processing vessel is different when viewed from a direction normal to the surface of the substrate, and a switchover between the first flow mode and the second flow mode is performed by the flow control device, by using the drain flow control device, in the first flow mode, a drain flow rate of the processing fluid into the first sub-drain line through the manifold is set to be smaller than a drain flow rate of the processing fluid into the second sub-drain line through the manifold, and by using the drain flow control device, in the second flow mode, a drain flow rate of the processing fluid into the first sub-drain line through the manifold is set to be larger than a drain flow rate of the processing fluid into the second sub-drain line through the manifold.

* * * * *